United States Patent
Okade et al.

(10) Patent No.: US 10,564,543 B2
(45) Date of Patent: *Feb. 18, 2020

(54) PHOTOSENSITIVE RESIN COMPOSITION, PHOTOSENSITIVE ELEMENT, METHOD FOR PRODUCING SUBSTRATE WITH RESIST PATTERN, AND METHOD FOR PRODUCING PRINTED WIRING BOARD

(71) Applicant: HITACHI CHEMICAL COMPANY, LTD., Tokyo (JP)

(72) Inventors: Shota Okade, Tokyo (JP); Yukiko Muramatsu, Tokyo (JP); Emiko Oota, Tokyo (JP); Ken Sawabe, Tokyo (JP); Sanchoru Ri, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/510,211

(22) PCT Filed: Sep. 14, 2015

(86) PCT No.: PCT/JP2015/076041
§ 371 (c)(1),
(2) Date: Mar. 9, 2017

(87) PCT Pub. No.: WO2016/043162
PCT Pub. Date: Mar. 24, 2016

(65) Prior Publication Data
US 2017/0261851 A1    Sep. 14, 2017

(30) Foreign Application Priority Data

Sep. 18, 2014 (JP) .................................. 2014-190158

(51) Int. Cl.
*G03F 7/033* (2006.01)
*G03F 7/032* (2006.01)
(Continued)

(52) U.S. Cl.
CPC ............ *G03F 7/033* (2013.01); *C08F 212/08* (2013.01); *C09D 125/14* (2013.01); *G03F 7/027* (2013.01);
(Continued)

(58) Field of Classification Search
None
See application file for complete search history.

(56) References Cited

U.S. PATENT DOCUMENTS

2004/0063025 A1* 4/2004 Natori ..................... G03F 7/027
430/270.1
2004/0224259 A1 11/2004 Anzures et al.
(Continued)

FOREIGN PATENT DOCUMENTS

CN    101738861 A      6/2010
JP    2002-323760    * 11/2002
(Continued)

OTHER PUBLICATIONS

Jiang et al., "Novel photosensitizer and methoxy styryl pyridines for photoradical initiator system", J. Photopoly. Sci. Tech., vol. 22(3) pp. 351-356 (2009).*

(Continued)

*Primary Examiner* — Martin J Angebranndt
(74) *Attorney, Agent, or Firm* — Fitch, Even, Tabin & Flannery, L.L.P.

(57) ABSTRACT

A photosensitive resin composition includes (A) a binder polymer having a structural unit derived from a hydroxyalkyl (meth)acrylate ester having a hydroxyalkyl group
(Continued)

having from 1 to 12 carbon atoms, and a structural unit derived from a (meth)acrylic acid; (B) a photopolymerizable compound having an ethylenically unsaturated bond group; (C) a photopolymerization initiator; and (D) a styryl pyridine represented by the Formula (1). In Formula (1), each of $R^1$, $R^2$ and $R^3$ independently represents an alkyl group having from 1 to 20 carbon atoms, an alkoxy group having from 1 to 6 carbon atoms, an alkyl ester group having from 1 to 6 carbon atoms, an amino group, an alkyl amino group having from 1 to 20 carbon atoms, a carboxy group, a ciano group, a nitro group, an acetyl group or a (meth)acryloyl group, each of a, b and c independently represents an integer of from 0 to 5. In a case in which each of a, b and c is independently 2 or more, the plural $R^1$s, $R^2$s, and $R^3$s independently may be the same or different.

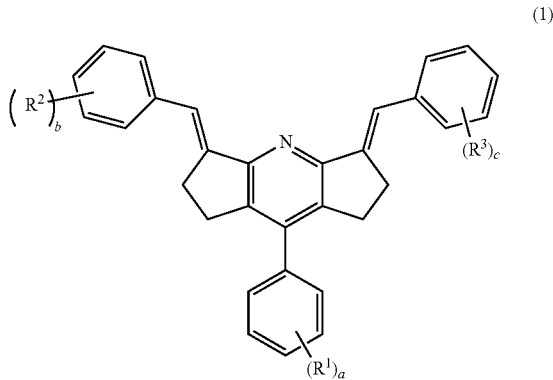

(1)

15 Claims, 2 Drawing Sheets

(51) Int. Cl.
| | | |
|---|---|---|
| G03F 7/11 | (2006.01) | |
| G03F 7/16 | (2006.01) | |
| G03F 7/20 | (2006.01) | |
| G03F 7/32 | (2006.01) | |
| H05K 3/06 | (2006.01) | |
| C08F 212/08 | (2006.01) | |
| G03F 7/029 | (2006.01) | |
| C09D 125/14 | (2006.01) | |
| G03F 7/027 | (2006.01) | |
| G03F 7/031 | (2006.01) | |
| H05K 3/18 | (2006.01) | |

(52) U.S. Cl.
CPC ............. *G03F 7/029* (2013.01); *G03F 7/031* (2013.01); *G03F 7/11* (2013.01); *G03F 7/16* (2013.01); *G03F 7/168* (2013.01); *G03F 7/2006* (2013.01); *G03F 7/322* (2013.01); *H05K 3/064* (2013.01); *C08F 2800/20* (2013.01); *H05K 3/184* (2013.01); *H05K 3/188* (2013.01); *H05K 2203/107* (2013.01)

(56) References Cited

U.S. PATENT DOCUMENTS

| | | |
|---|---|---|
| 2006/0058472 A1 | 3/2006 | Anzures et al. |
| 2011/0111344 A1* | 5/2011 | Ajioka .................... G03F 7/027 430/281.1 |
| 2016/0330845 A1* | 11/2016 | Okade .................... G03F 7/027 |

FOREIGN PATENT DOCUMENTS

| | | | |
|---|---|---|---|
| JP | 2004-225040 A | 8/2004 | |
| JP | 2006-145844 | * 6/2006 | |
| JP | 2006-234995 A | 9/2006 | |
| JP | 2006-293094 | * 10/2006 | |
| JP | 2007-114452 A | 5/2007 | |
| JP | 2007-256832 A | 10/2007 | |
| JP | 2010-072535 A | 4/2010 | |
| JP | 2012-198573 | * 10/2012 | ............... G03F 7/32 |
| JP | 2014-182282 A | 9/2014 | |
| TW | 201011468 A | 3/2010 | |
| WO | 2008/078483 A1 | 7/2008 | |
| WO | 2010/098175 A1 | 9/2010 | |
| WO | 2010/098183 A1 | 9/2010 | |
| WO | 2012/067107 A1 | 5/2012 | |

OTHER PUBLICATIONS

Machine translation of Murakami et al. CN 101738861.*
International Search Report for PCT/JP2015/076041 dated Nov. 10, 2015; English translation submitted herewith (5pages).
English language machine translation of JP 2006-145844 A to Arihisa et al.

* cited by examiner

PHOTOSENSITIVE RESIN COMPOSITION, PHOTOSENSITIVE ELEMENT, METHOD FOR PRODUCING SUBSTRATE WITH RESIST PATTERN, AND METHOD FOR PRODUCING PRINTED WIRING BOARD

CROSS-REFERENCE TO RELATED APPLICATIONS

This application is a U.S. national phase application filed under 35 U.S.C. § 371 of International Application No. PCT/JP2015/076041, filed Sep. 14, 2015, designating the United States, which claims priority from Japanese Patent Application No. 2014-190158, filed Sep. 18, 2014, which are hereby incorporated herein by reference in their entireties.

TECHNICAL FIELD

The present invention relates to a photosensitive resin composition, a photosensitive element, a method for producing a substrate with a resist pattern, and a method for producing a printed wiring board.

BACKGROUND ART

In the field of producing printed wiring boards, photosensitive resin compositions have been widely employed as resist materials used for etching or plating. The photosensitive resin composition is often used as a photosensitive element (layered product) provided with a support and a layer which is formed on the support using the photosensitive resin composition (hereinafter, sometimes referred to as "photosensitive resin composition layer").

For example, the printed wiring board is manufactured as follows. First, a photosensitive resin composition layer is formed on a substrate for forming circuits using a photosensitive element (photosensitive layer forming process). Next, the predetermined area of the photosensitive resin composition layer is irradiated with active light rays to cure the exposed area (exposure process). Then, a support is peeled, and the unexposed area of the photosensitive resin composition layer is then removed (developed) from the substrate, thereby forming a resist pattern, which is the cured material of the photosensitive resin material (hereinafter, sometimes referred to as "resist cured product"), on the substrate for forming circuits (developing process). The resist pattern obtained is used for etching or plating to form a circuit on the substrate (circuit forming process), and finally the resist pattern is released and removed (releasing process) to produce a printed wiring board.

As an method of exposure, a method in which exposure is carried out through a photomask using a mercury lamp as a light source is conventionally employed. Recently, an method of exposure called DLP (Digital Light Processing) or LDI (Laser Direct Imaging) has been proposed as a direct writing exposure method that allows direct formation of patterns. Such a direct writing method of exposure has improved alignment accuracy than the method of exposure through a photomask and allows the formation of finer patterns, and therefore increasingly used to manufacture substrates for high density package substrates.

In general, in the exposure process, the exposure time is desired to be reduced in order to improve the production efficiency. In the above-described direct writing method of exposure, however, monochromatic light such as laser is used as a light source and the substrate is irradiated with light rays while scanning. Therefore, the direct writing method of exposure tends to require a longer exposure time as compared to the conventional method of exposure carried out through a photomask. Accordingly, in order to reduce the exposure time to improve the production efficiency, it is necessary to improve the sensitivity of the photosensitive resin composition than the conventional one.

Meanwhile, in association with recent increase in density of printed wiring boards, the demand for a photosensitive resin composition that allows the formation of a resist pattern with sufficient resolution (resolution property) and adhesiveness is increasing. In particular, it is difficult to form a resist pattern having a L/S (line width/space width) of 10/10 (unit: μm) or less in manufacture of a package substrate.

Regarding these demands, various photosensitive resin compositions have been examined in the past. For example, a photosensitive resin composition in which the above required features are improved by using a styryl pyridine as a sensitizing dye is proposed in, for example, Chinese Patent Publication No. 101738861. Further, a photosensitive resin composition in which the above required features are improved by using a specific binder polymer, a photopolymerizable compound, a photopolymerization initiator, and a sensitizing dye is proposed in Japanese Patent Application Laid-Open (JP-A) Nos. 2006-234995 and 2007-114452, and International Publications Nos. WO 08/078483, WO 10/098175 and WO 10/098183.

SUMMARY OF INVENTION

Technical Problem

Although the styryl pyridine compound disclosed in the specification of Chinese Patent Publication No. 101738861 works better in improving the sensitivity than other sensitizing dyes used at the time, the effect of improving the resolution is insufficient. Therefore, styryl pyridine compounds have not been aggressively used for high resolution. On the other hand, the photosensitive resin compositions disclosed in JP-A Nos. 2006-234995 and 2007-114452, and International Publications Nos. WO 08/078483, WO 10/098175 and WO 10/098183 need work in terms of improving the balance between sensitivity, resolution and adhesiveness. Especially, in the present field, improving the resolution of a resist pattern and the adhesiveness in a 1 μm unit is strongly demanded.

The object of the present invention is to provide a photosensitive resin composition that allows the formation of a resist pattern excellent in terms of the properties of resolution and adhesiveness with excellent sensitivity, a photosensitive element using the photosensitive resin composition, a method for producing a substrate with a resist pattern, and a method for producing a printed wiring board.

Solution to Problem

The present inventors researched earnestly in order to solve the above-mentioned problems, and as a result, they have found that a photosensitive resin composition which allows the formation of a resist pattern excellent in terms of the properties of resolution and adhesiveness with excellent sensitivity can be obtained by combining a styryl pyridine represented by the Formula (1), a binder polymer having a structural unit derived from a hydroxyalkyl (meth)acrylate ester having a hydroxyalkyl group having from 1 to 12 carbon atoms, and a structural unit derived from a (meth)

acrylic acid, a photopolymerizable compound having an ethylenically unsaturated bond group, a photopolymerization initiator.

That is, a first embodiment of the present invention is a photosensitive resin composition including (A) a binder polymer having a structural unit derived from a hydroxyalkyl (meth)acrylate ester having a hydroxyalkyl group having from 1 to 12 carbon atoms, and a structural unit derived from a (meth)acrylic acid; (B) a photopolymerizable compound having an ethylenically unsaturated bond group; (C) a photopolymerization initiator; and (D) a styryl pyridine represented by the Formula (1).

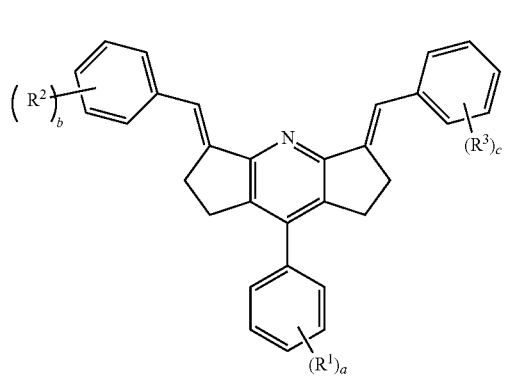

(1)

In Formula (1), each of $R^1$, $R^2$ and $R^3$ independently represents an alkyl group having from 1 to 20 carbon atoms, an alkoxy group having from 1 to 6 carbon atoms, an alkyl ester group having from 1 to 6 carbon atoms, an amino group, an alkyl amino group having from 1 to 20 carbon atoms, a carboxy group, a ciano group, a nitro group, an acetyl group or a (meth)acryloyl group, each of a, b and c independently represents an integer of from 0 to 5. In a case in which a is 2 or more, the plural $R^1$s may be the same or different. In a case in which b is 2 or more, the plural $R^2$s may be the same or different. In a case in which c is 2 or more, the plural $R^3$s may be the same or different.

Taking the above-mentioned embodiment, a photosensitive resin composition allows the formation of a resist pattern excellent in terms of the properties of resolution and adhesiveness with excellent sensitivity. The above-mentioned photosensitive resin composition allows the formation of a resist pattern having an L/S (line width/space width) of 10/10 (unit: μm) or less.

Regarding the photosensitive resin composition, it is preferable that (A) a binder polymer further has a structural unit derived from styrene or α-methylstyrene from the viewpoint of improving adhesiveness and release property of the resist pattern.

Regarding the photosensitive resin composition, it is preferable that (C) the photopolymerization initiator includes at least one selected from the group consisting of 2,4,5-triarylimidazole dimer and a derivative thereof from the viewpoint of improving sensitivity, and adhesiveness and release property of the resist pattern.

A second embodiment of the present invention is a photosensitive element having a support and a photosensitive resin composition layer that is provided on the support and that is formed from the photosensitive resin composition according to the first embodiment. Use of such a photosensitive element allows efficient formation of a resist pattern excellent in especially resolution and adhesiveness with excellent sensitivity.

A third embodiment of the present invention is a method for producing a substrate with a resist pattern, the method comprising: forming a photosensitive resin composition layer on a substrate using the photosensitive resin composition according to the first embodiment; irradiating at least a part of an area of the photosensitive resin composition layer with active light rays, and photo-curing the area to form a cured material area; and removing an area other than the cured material area of the photosensitive resin composition layer from the substrate to form a resist pattern, which is the cured material area, on the substrate. This method for producing a substrate with a resist pattern allows efficient formation of a resist pattern excellent in terms of the properties of resolution and adhesiveness with excellent sensitivity.

In the method for producing a substrate with a resist pattern, the wavelength of the active light rays to be applied is preferably in a range of from 340 nm to 430 nm. This allows more efficient formation of a resist pattern better in resolution and adhesiveness with excellent sensitivity.

A fourth embodiment of the present invention is a method for producing a printed wiring board, the method including: subjecting the substrate with the resist pattern which has been formed using the method for producing a substrate with a resist pattern according to the third embodiment, to at least one of etching or plating. This producing method allows efficient manufacture of a printed wiring board having wiring with an increased density such as a high density package substrate, with excellent accuracy and excellent production efficiency.

Advantageous Effects of Invention

According to the present invention, there can be provided a photosensitive resin composition that allows the formation of a resist pattern satisfactory in terms of the properties of resolution and adhesiveness with excellent sensitivity; a photosensitive element prepared using the photosensitive resin composition; a method for producing a substrate with a resist pattern; and a method for producing a printed wiring board.

DESCRIPTION OF EMBODIMENTS

Figure 1:
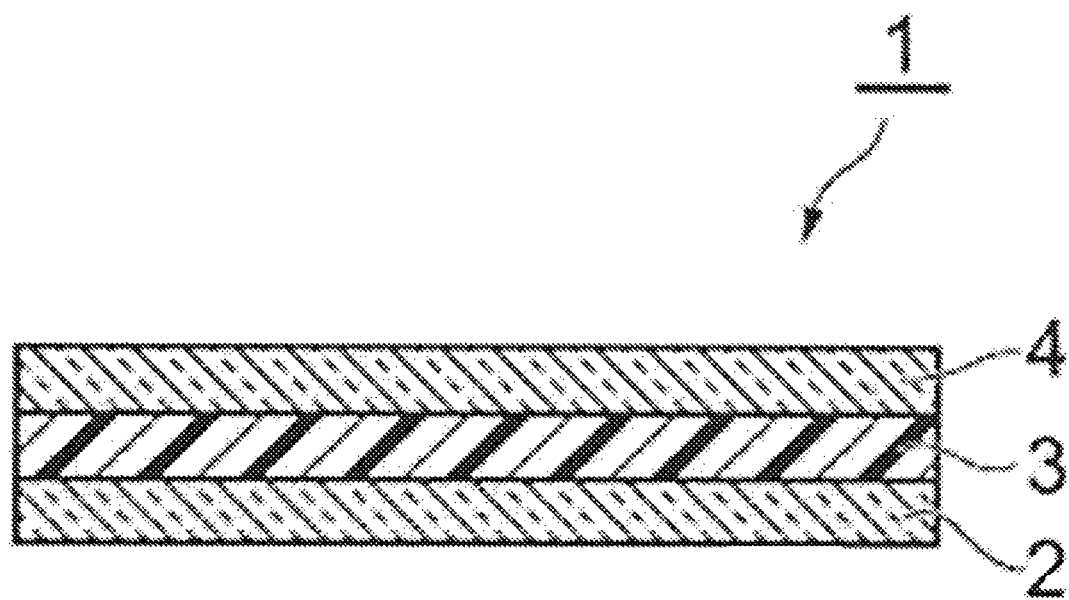
FIG. 1 is a schematic cross sectional view illustrating an embodiment of a photosensitive element according to the present invention.

Embodiments to implement the present invention are described in detail. However, the present invention is not limited to the following embodiments. In addition, in the following embodiments, their constituents (also including constituent steps) are not necessarily essential unless otherwise clearly indicated. This is true for numerical values and ranges and does not unfairly limit the present invention.

As used herein, the term "(meth)acrylic acid" means acrylic acid or methacrylic acid, the term "(meth)acrylate" means an acrylate or a methacrylate, and the term "(meth)acryloyloxy group" means an acryloyloxy group or a meth-acryloyloxy group. The term "(poly)ethyleneoxy" as used here in means at least one of an ethyleneoxy group or a polyethyleneoxy group in which two or more ethylene groups are linked via an ether bond. The term "(poly) propyleneoxy group" as used here in means at least one of a propyleneoxy group or a polypropyleneoxy group in which two or more propylene groups are linked via an ether bond. The term "EO-modified" compound means a compound having a (poly)ethyleneoxy group; "PO-modified" compound means a compound having a (poly)propyleneoxy group; and "EO, PO-modified" compound means a compound having both a (poly)ethyleneoxy group and a (poly) propyleneoxy group.

The term "layer" as used here in indicates not only a structure having a shape formed on a whole surface but also a structure having a shape formed on a part of a surface when observed in a plane view. The term "layered" as used here in indicates "provided on or above", in which two or more layers may be linked or detachable.

The term "process" as used here in indicates not only a separate process but also a process that is not clearly distinguished from other processes as long as the desired effect of the process is obtained therefrom. In the present specification, each numerical range specified using "(from) . . . to . . . " represents a range including the numerical values noted before and after "to" as the minimum value and the maximum value, respectively. Furthermore, when plural kinds of substances that correspond to the same component exist in the composition, the amount of the component in the composition refers to the total mass of the plural kinds of substances unless otherwise specified. Regarding the numerical ranges of stepwise description in the present specification, an upper limit or a lower limit described in one numerical range may be replaced with an upper limit or a lower limit described in another numerical range. Regarding the numerical ranges in the present specification, an upper limit or a lower limit in a numerical range may be replaced with a value shown in Examples.

Photosensitive Resin Composition

The photosensitive resin composition of the present embodiment includes component (A): a binder polymer having a structural unit derived from a hydroxyalkyl (meth) acrylate ester having a hydroxyalkyl group having from 1 to 12 carbon atoms, and a structural unit derived from a (meth)acrylic acid; component (B): a photopolymerizable compound having an ethylenically unsaturated bond group; component (C): a photopolymerization initiator; and component (D): a styryl pyridine represented by the Formula (1). From the viewpoint of more enhanced adhesiveness and release property, (A) a binder polymer further has a structural unit derived from styrene or α-methylstyrene. The photosensitive resin composition may further include other components, if necessary.

The inclusion of the binder polymer having a structural unit derived from a hydroxyalkyl (meth)acrylate ester having a hydroxyalkyl group having from 1 to 12 carbon atoms, and a structural unit derived from a (meth)acrylic acid; a photopolymerizable compound having an ethylenically unsaturated bond group; a photopolymerization initiator; and a styryl pyridine represented by the Formula (1) allows constitution of a photosensitive resin composition that allows the formation of a resist pattern excellent in terms of the properties of resolution and adhesiveness with excellent sensitivity.

Component (A): Binder Polymer

The photosensitive resin composition includes, as the component (A), a structural unit derived from a hydroxyalkyl (meth)acrylate ester having a hydroxyalkyl group having from 1 to 12 carbon atoms, and a structural unit derived from a (meth)acrylic acid (hereinafter, sometimes referred to as "specific binder polymer"). The component (A) may, if necessary, further include a binder polymer other than the specific binder polymer.

In the specific binder polymer, the content ratio of the structural unit derived from a (meth)acrylic acid in the specific binder polymer is preferably from 15% by mass to 40% by mass, more preferably from 18% by mass to 38% by mass, and still more preferably from 20% by mass to 35% by mass, in terms of excellent developability and adhesiveness, based on the total mass (hereinafter, referred to as 100% by mass) of the polymerizable monomer for constituting the binder polymer. In terms of excellent developability, the content ratio is preferably 15% by mass or more, more preferably 18% by mass or more, and still more preferably 20% by mass or more. In terms of excellent adhesiveness, the content ratio is preferably 40% by mass or less, more preferably 38% by mass or less, and still more preferably 35% by mass or less.

From the viewpoint of more enhanced resolution and release property, the content ratio of the structural unit derived from a hydroxyalkyl (meth)acrylate ester having a hydroxyalkyl group having from 1 to 12 carbon atoms in the specific binder polymer is preferably from 1% by mass to 50% by mass, more preferably from 2% by mass to 30% by mass, and still more preferably from 2% by mass to 20% by mass, based on the total mass of the polymerizable monomer for constituting the specific binder polymer. In terms of excellent resolution, the content ratio is preferably 50% by mass or less, more preferably 30% by mass or less, still more preferably 20% by mass or less, even more preferably 15% by mass or less, and particularly preferably 10% by mass or less. In terms of excellent release property and adhesiveness, the content ratio is preferably 1% by mass or more, more preferably 2% by mass or more, and still more preferably 2.5% by mass or more.

The hydroxyalkyl group of the hydroxyalkyl (meth)acrylate ester is a hydroxyalkyl group having from 1 to 12 carbon atoms, preferably a hydroxyalkyl group having from 1 to 8 carbon atoms, more preferably a hydroxyalkyl group having from 1 to 6 carbon atoms, and still more preferably a hydroxyalkyl group having from 1 to 4 carbon atoms. Use of such a range can improve resolution, adhesiveness, and flexibility at excellent balance. In a case in which the number of carbon atoms is 4 or less, the resolution property can be more improved.

The specific binder polymer further may have a structural unit derived from styrene or α-methylstyrene. In case in which the specific binder polymer further has a structural unit derived from styrene or α-methylstyrene, the content ratio of the structural unit derived from styrene or α-methylstyrene is preferably from 10% by mass to 70% by mass, more preferably from 15% by mass to 60% by mass, and still more preferably from 20% by mass to 55% by mass, based on the total mass of the polymerizable monomer for constituting the specific binder polymer, in terms of excellent adhesiveness and release property. In terms of excellent adhesiveness, the content ratio is preferably 10% by mass or more, more preferably 15% by mass or more, and still more preferably 20% by mass or more. In terms of release property, the content ratio is preferably 70% by mass or less, more preferably 60% by mass or less, still more preferably 55% by mass or less.

The specific binder polymer may have other structural units other than the above-described structural units.

Examples of such other structural units include structural units derived from other polymerizable monomers described below.

Such other polymerizable monomers are not particularly limited as long as they are polymerizable monomers that are polymerizable with a hydroxyalkyl (meth)acrylate ester having a hydroxyalkyl group having from 1 to 12 carbon atoms and a (meth)acrylic acid, and further optional styrene or α-methylstyrene, and are different from a hydroxyalkyl (meth)acrylate ester having a hydroxyalkyl group having from 1 to 12 carbon atoms and a (meth)acrylic acid, and styrene or α-methylstyrene. Examples of such other polymerizable monomers include (meth)acrylic acid esters such as alkyl (meth)acrylates, cycloalkyl (meth)acrylates, benzyl (meth)acrylate, furfuryl (meth)acrylate, tetrahydrofurfuryl (meth)acrylate, isobornyl (meth)acrylate, adamantyl (meth)acrylate, dicyclopentanyl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, dicyclopentenyloxyethyl (meth)acrylate, dicyclopentanyloxyethyl (meth)acrylate, isobornyloxyethyl (meth)acrylate, cyclohexyloxyethyl (meth)acrylate, adamantyloxyethyl (meth)acrylate, dicyclopentenyloxypropyloxyethyl (meth)acrylate, dicyclopentanyloxypropyloxyethyl (meth)acrylate, and adamantyloxypropyloxyethyl (meth)acrylate; (meth)acrylic acid derivatives such as α-bromoacrylic acid, α-chloroacrylic acid, β-furyl(meth)acrylic acid, and β-styryl(meth)acrylic acid; polymerizable styrene derivatives substituted on their aromatic rings; acrylamides such as diacetoneacrylamide; acrylonitrile; ether compounds of vinyl alcohol such as vinyl-n-butyl ether; maleic acid; maleic anhydride; maleic acid monoesters such as monomethyl maleate, monoethyl maleate, and monoisopropyl maleate; and unsaturated carboxylic acid derivatives such as fumaric acid, cinnamic acid, α-cyanocinnamic acid, itaconic acid, crotonic acid, and propiolic acid. These may be used singly, or in any combination of two or more kinds thereof.

In case in which the binder polymer has other structural units, the content ratio thereof based on the total mass of the polymerizable monomer for constituting the specific binder polymer is preferably from 3% by mass to 85% by mass, more preferably from 5% by mass to 75% by mass, still more preferably from 10% by mass to 70% by mass, and even more preferably from 10% by mass to 50% by mass, in terms of excellent resolution and release property.

The specific binder polymer can be obtained, for example, by radical polymerization of a hydroxyalkyl (meth)acrylate ester having a hydroxyalkyl group having from 1 to 12 carbon atoms, and a (meth)acrylic acid, and optionally styrene or α-methylstyrene and other polymerizable monomers, using an ordinary method.

As a component (A), a specific binder polymer may be used singly, or in any combination of two or more kinds thereof. The component (A) may further include a binder polymer other than the specific binder polymer.

The acid value of the specific binder polymer is preferably from 90 mg KOH/g to 250 mg KOH/g, more preferably from 100 mg KOH/g to 240 mg KOH/g, still more preferably from 120 mg KOH/g to 235 mg KOH/g, and even more preferably from 130 mg KOH/g to 230 mg KOH/g, in terms of excellent in developability and adhesiveness at excellent balance. In terms of reducing developing time, the acid value is preferably 90 mg KOH/g or more, more preferably 100 mg KOH/g or more, still more preferably 120 mg KOH/g or more, and even more preferably 130 mg KOH/g or more. In terms of achieving the sufficient adhesiveness of the cured product of the photosensitive resin composition, the acid value is preferably 250 mg KOH/g or less, more preferably 240 mg KOH/g or less, still more preferably 235 mg KOH/g or less, and even more preferably 230 mg KOH/g or less.

The weight-average molecular weight (Mw) of the specific binder polymer measured by gel permeation chromatography (GPC) (calculated based on a calibration curve produced using polystyrene standards) is preferably from 10,000 to 200,000, more preferably from 15,000 to 100,000, still more preferably from 20,000 to 80,000, and even more preferably from 23,000 to 60,000, in terms of excellent in developability and adhesiveness at excellent balance. In terms of excellent developability, the weight-average molecular weight is preferably 200,000 or less, more preferably 100,000 or less, still more preferably 80,000 or less, and even more preferably 60,000 or less. In terms of excellent adhesiveness, the weight-average molecular weight is preferably 10,000 or more, more preferably 15,000 or more, still more preferably 20,000 or more, even more preferably 23,000 or more, and particularly preferably 25,000 or more.

The dispersivity (weight-average molecular weight/number-average molecular weight) of the binder polymer is preferably 3.0 or less, more preferably 2.8 or less, and still more preferably 2.5 or less, in terms of excellent resolution and adhesiveness.

The binder polymer may have, in the molecule thereof, a characteristic group with sensitivity to light having a wavelength in a range of from 340 nm to 430 nm if necessary. Examples of the characteristic group include a group obtained by removing at least one hydrogen atom from the sensitizing dye described below.

The content of the component (A) in the photosensitive resin composition is preferably from 30 parts by mass to 70 parts by mass, more preferably from 35 parts by mass to 65 parts by mass, and still more preferably from 40 parts by mass to 60 parts by mass, with respect to 100 parts by mass of the total amount of the component (A) and the component (B), in terms of excellent film formability (photosensitive resin composition layer formability), sensitivity, and resolution. In terms of film (photosensitive resin composition layer) formability, the content is preferably 30 parts by mass or more, more preferably 35 parts by mass or more, and still more preferably 40 parts by mass or more. In terms of improving sensitivity and resolution, the content is preferably 70 parts by mass or less, more preferably 65 parts by mass or less, and still more preferably 60 parts by mass or less. The content of the component (A) means a mass of non-volatile content (solid content). The "non-volatile content" refers to a component other than volatile material in the compound. The "volatile material" refers to a material having a boiling point of 170° C. or lower at atmospheric pressure.

Component (B): Photopolymerizable Compound

The photopolymerizable compound (hereinafter, sometimes referred to as "component (B)") is explained. The photopolymerizable compound, which is the component (B), includes at least one photopolymerizable compound having an ethylenically unsaturated bond group.

The photopolymerizable compound contains a photopolymerizable compound having an ethylenically unsaturated bond group. Examples of the compound having an ethylenically unsaturated bond include a compound having one ethylenically unsaturated bond in the molecule, a compound having two ethylenically unsaturated bonds in the molecule, and a compound having three or more ethylenically unsaturated bonds in the molecule.

The component (B) preferably includes at least one of the compound having two ethylenically unsaturated bonds in the molecule. In a case in which the component (B) includes the compound having two ethylenically unsaturated bonds in the molecule, the content with respect to 100 parts by mass of the total mass of the component (A) and the component (B) is preferably from 5 parts by mass to 70 parts by mass, more preferably from 5 parts by mass to 65 parts by mass, and still more preferably from 10 parts by mass to 60 parts by mass.

Examples of the compound having two ethylenically unsaturated bonds in the molecule include a bisphenol A di(meth)acrylate compound; a hydrogenated bisphenol A di(meth)acrylate compound; a di(meth)acrylate compound having a urethane bond in the molecule; a polyalkylene glycol di(meth)acrylate having at least one of a (poly)ethyleneoxy group or a (poly)propyleneoxy group in the molecule, and trimethylolpropane di(meth)acrylate.

In terms of excellent resolution and release property, the component (B) preferably includes at least one compound having two ethylenically unsaturated bonds in the molecule selected from the group consisting of a bisphenol A di(meth)acrylate compound; a hydrogenated bisphenol A di(meth)acrylate compound; a polyalkylene glycol di(meth)acrylate having at least one of a (poly)ethyleneoxy group or a (poly)propyleneoxy group in the molecule, more preferably at least one of bisphenol A di(meth)acrylate compound, still more preferably at least one of bisphenol A di(meth)acrylate compound having an ethyleneoxy group and the number of the structural units of the ethyleneoxy group being 8 or less.

Examples of the bisphenol A di(meth)acrylate compound include a compound represented by the following Formula (3).

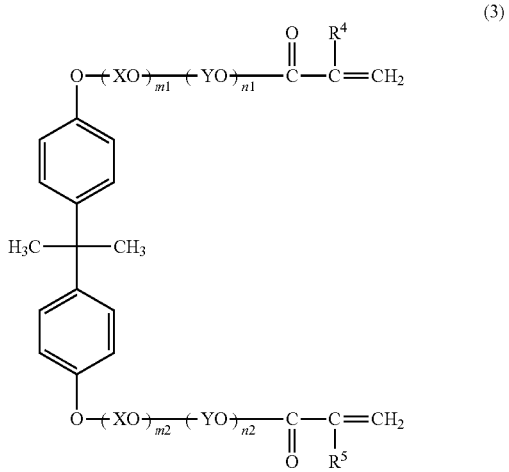

(3)

In Formula (3), each of $R^4$ and $R^5$ independently represents a hydrogen atom or a methyl group. Each of XO and YO independently represents an ethyleneoxy group or a propyleneoxy group. Each of $(XO)m_1$ and $(YO)n_1$ independently represents a (poly)ethyleneoxy group or a (poly)propyleneoxy group. Each of $(XO)m_2$ and $(YO)n_2$ independently represents a (poly)ethyleneoxy group or a (poly)propyleneoxy group. Each of $m_1$, $m_2$, $n_1$ and $n_2$ independently represents 0 to 40. Each of $m_1$, $m_2$, $n_1$ and $n_2$ represents the number of the structural unit. Therefore, the number of the structural unit indicates an integer value with respect to a single molecule, while it represents a rational number, which is an average value, with respect to a group of plural kinds of molecules. Hereinbelow, the same applies to the number of the structural unit. An ethyleneoxy group is sometimes called oxyethylene, and a propyleneoxy group is sometimes called oxypropylene.

In case in which the compound has propyleneoxy group, the total number of the structural units of an propyleneoxy group in the compound is preferably 2 or more, more preferably 3 or more, and still more preferably 4 to more, in terms of more enhanced resolution property. It is preferably 5 or less, in terms of more enhanced developability.

In case in which the compound has ethyleneoxy group, the total number of the structural units of an ethyleneoxy group in the compound is preferably 4 or more, more preferably 6 or more, and still more preferably 8 or more, in terms of more enhanced developability. It is preferably 16 or less, and more preferably 14 or less, in terms of more enhanced resolution property.

Among compounds represented by the above-described Formula (3), examples of commercially available 2,2-bis(4-(methacryloxy dodecaethoxy tetrapropoxy)phenyl) propane include FA-3200MY (manufactured by Hitachi Chemical Co., Ltd., trade name), examples of commercially available 2,2-bis(4-(methacryloxy diethoxy)phenyl)propane include FA-324M (manufactured by Hitachi Chemical Co., Ltd., trade name), 2,2-bis(4-(methacryloxy pentaethoxy)phenyl) propane includes BPE-500 (manufactured by Shin-Nakamura Chemical Co., Ltd., trade name) and FA-321M (manufactured by Hitachi Chemical Co., Ltd., trade name), and 2,2-bis(4-(methacryloxy pentadecaethoxy)phenyl)propane include BPE-1300 (manufactured by Shin-Nakamura Chemical Co., Ltd., trade name). These may be used singly, or in any combination of two or more kinds thereof.

In a case in which the photosensitive resin composition contains the bisphenol A di(meth)acrylate compound as the component (B), the content thereof is preferably from 1 parts by mass to 65 parts by mass, more preferably from 5 parts by mass to 60 parts by mass, and still more preferably from 10 parts by mass to 55 parts by mass with respect to 100 parts by mass of the total mass of the component (A) and the component (B).

Examples of the hydrogenated bisphenol A di(meth)acrylate compound include 2,2-bis(4-(methacryloxy pentaethoxy)cyclohexyl)propane. In a case in which the photosensitive resin composition contains the hydrogenated bisphenol A di(meth)acrylate compound, the content thereof is preferably from 1 parts by mass to 50 parts by mass, and more preferably from 5 parts by mass to 40 parts by mass, with respect to 100 parts by mass of the total mass of the component (A) and the component (B).

It is preferable that the component (B) includes, as the additional photopolymerizable compound, at least one polyalkylene glycol di(meth)acrylate, from the viewpoint of improving flexibility of the resist pattern. In a case in which the photosensitive resin composition includes the polyalkylene glycol di(meth)acrylate, the content thereof is preferably from 5 parts by mass to 30 parts by mass, and more preferably from 10 parts by mass to 25 parts by mass, with respect to 100 parts by mass of the total amount of the component (A) and the component (B).

The polyalkylene glycol di(meth)acrylate is preferably a polyalkylene glycol di(meth)acrylate having both of a (poly)ethyleneoxy group and a (poly)propyleneoxy group in the molecule. In the molecule of the polyalkylene glycol di(meth)acrylate, each of the(poly)ethyleneoxy group and the (poly)propyleneoxy group may be present as continuous blocks or present randomly. Here, the propyleneoxy group of the (poly)propyleneoxy group may be either a n-propyleneoxy group or an isopropyleneoxy group. In the (poly) isopropyleneoxy group, the oxygen atom may bind to the secondary carbon atom of the propylene group, or the primary carbon atom thereof.

The polyalkylene glycol di(meth)acrylate may include (poly)n-butyleneoxy group, (poly)isobutyleneoxy group, (poly)n-pentyleneoxy group, or (poly)hexyleneoxy group, or the constitutional isomer thereof, such as (poly)alkyleneoxy group having from about 4 to about 6 carbon atoms.

The component (B) may include, as the additional photopolymerizable compound, at least one photopolymerizable compound having three or more ethylenically unsaturated bonds in the molecule thereof.

Examples of the compound having three or more ethylenically unsaturated bonds in the molecule thereof include trimethylolpropane tri(meth)acrylate, an EO-modified trimethylolpropane tri(meth)acrylate (in which the number of structural units of the ethyleneoxy group is from 1 to 5), a PO-modified trimethylolpropane tri(meth)acrylate, an EO, PO-modified trimethylolpropane tri(meth)acrylate, tetramethylolmethane tri(meth)acrylate, tetramethylolmethane tetra(meth)acrylate, pentaerythritol tri(meth)acrylate, ethoxylated pentaerythritol tetraacrylate, and dipentaerythritol hexa(meth)acrylate. These compounds may be used singly, or in combination of two or more kinds thereof.

Examples of commercially available tetramethylolmethane triacrylate include A-TMM-3 (manufactured by Shin-Nakamura Chemical Co., Ltd., trade name), EO-modified trimethylolpropane trimethacrylate includes TMPT21E and TMPT30E" (manufactured by Hitachi Chemical Co., Ltd, sample name), pentaerythritol triacrylate includes SR444 (manufactured by Sartomer, trade name), dipentaerythritol hexaacrylate includes A-DPH (manufactured by Shin-Nakamura Chemical Co., Ltd., trade name), and ethoxylated pentaerythritol tetraacrylate includes ATM-35E manufactured by Shin-Nakamura Chemical Co., Ltd).

In a case in which the component (B) includes, as the additional photopolymerizable compound, the compound having three or more ethylenically unsaturated bonds, the content thereof is preferably from 3 parts by mass to 30 parts by mass, more preferably from 5 parts by mass to 25 parts by mass, and still more preferably from 5 parts by mass to 20 parts by mass, with respect to 100 parts by mass of the total amount of the component (A) and the component (B), from the viewpoint of improving resolution, adhesiveness, resist shape, and release property after curing at excellent balance.

The component (B) may include, as the additional photopolymerizable compound, a compound having one ethylenically unsaturated bond in the molecule, in terms of improving resolution, adhesiveness, resist shape and release property after curing at excellent balance, or suppressing the occurrence of scum.

Examples of the compound having one ethylenically unsaturated bond in the molecule include nonylphenoxy polyethyleneoxy acrylate, a phthalic acid compound, and an alkyl (meth)acrylate. Among these, from the viewpoint of improving resolution, adhesiveness, resist shape and release property after curing at excellent balance, it is preferable to include nonylphenoxy polyethyleneoxy acrylate or a phthalic acid compound.

In a case in which the component (B) includes, as the additional photopolymerizable compound, the photopolymerizable compound having one ethylenically unsaturated bond in the molecule, the content thereof is preferably from 1 part by mass to 20 parts by mass, more preferably from 3 parts by mass to 15 parts by mass, and still more preferably from 5 parts by mass to 12 parts by mass, with respect to 100 parts by mass of the total amount of the component (A) and the component (B).

The total content of the component (B) in the photosensitive resin composition is preferably from 30 parts by mass to 70 parts by mass, more preferably from 35 parts by mass to 65 parts by mass, and still more preferably from 35 parts by mass to 60 parts by mass, with respect to 100 parts by mass of the total amount of the component (A) and the component (B). In a case in which the content is 30 parts by mass or more, sufficient sensitivity and sufficient resolution can be easily obtained. In a case in which the content is 70 parts by mass or less, the film (photosensitive resin composition layer) can be easily formed and the excellent resist shape can be easily obtained.

Component (C): Photopolymerization Initiator

The photosensitive resin composition includes, as component (C), at least one photopolymerization initiator. In terms of excellent sensitivity and adhesiveness, at least one of 2,4,5-triarylimidazole dimers or derivatives thereof is preferably included. 2,4,5-triarylimidazole dimers or derivatives thereof may be a compound represented by the following Formula (2).

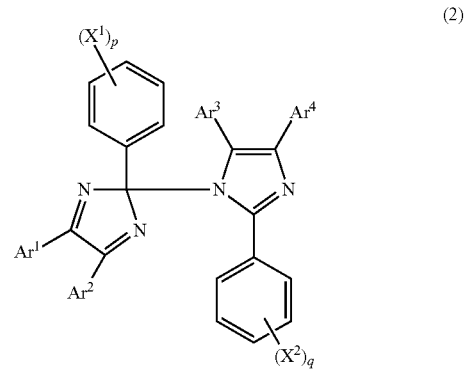

In Formula (2), each of $A^1$, $Ar^2$, $Ar^3$ and $Ar^4$ independently represents an aryl group which may be substituted with at least one group selected from the group consisting of an alkyl group, an alkenyl group and an alkoxy group, each of $X^1$ and $X^2$ independently represents a halogen atom, an alkyl group, an alkenyl group or an alkoxy group, each of p and q independently represents an integer of from 1 to 5. In a case in which p is 2 or more, the plural $X^1$s may be the same or different. In a case in which q is 2 or more, the plural $X^2$s may be the same or different.

At least one of $X^1$ and $X^2$ is preferably a halogen atom. The substituent positions of $X^1$ and $X^2$ are not particularly limited, and preferably ortho-position or meta-position.

The aryl group represented by $Ar^1$, $Ar^2$, $Ar^3$ and $Ar^4$ includes a phenyl group, a naphthyl group and an anthracenyl group, and preferably a phenyl group.

In a case in which each of $Ar^1$, $Ar^2$, $Ar^3$ and $Ar^4$ independently has a substituent group, a number of the substituent group is preferably from 1 to 5, more preferably 1 to 3, and still more preferably 1. In a case in which each of $Ar^1$, $Ar^2$, $Ar^3$ and $Ar^4$ independently has a substituent group, the substituent position is not particularly limited. In a case in which the aryl group represented by Ar¹, Ar², Ar³ and Ar⁴ is phenyl group, the substituent position of the substituent group is preferably ortho-position or meta-position. Ar¹, Ar², Ar³ and Ar⁴ are preferably unsubstituted.

Each of p and q independently represents an integer of from 1 to 5, preferably an integer of from 1 to 3, and more preferably 1.

Examples of 2,4,5-triarylimidazole dimers or derivatives thereof include 2-(2-chlorophenyl)-4,5-diphenylimidazole dimer, 2-(2-chlorophenyl)-4,5-di(methoxyphenyl)imidazole dimer, 2-(2-fluorophenyl)-4,5-diphenylimidazole dimer, 2-(2-methoxyphenyl)-4,5-diphenylimidazole dimer, and 2-(4-methoxyphenyl)-4,5-diphenylimidazole dimer. The substituent groups on the aryl of the 2,4,5-triarylimidazole dimer may be same to give a symmetric compound, or be different to give an asymmetric compound. These compounds may be used singly, or in combination of two or more kinds thereof.

The photopolymerization initiator as component (C) may include other photopolymerization initiator that is usually used in the art other than 2,4,5-triarylimidazole dimers or derivatives thereof. Examples of other photopolymerization initiator include aromatic ketones such as benzophenone, 2-benzyl-2-dimethylamino-1-(4-morpholinophenyl)-butanone-1, or 2-methyl-1-[4-(methylthio)phenyl]-2-morpholino-propanone-1; quinones such as an alkylanthraquinone; benzo in ether compounds such as a benzo in alkyl ether; benzo in compounds such as benzo in and an alkyl benzoin; benzyl derivatives such as benzyl dimethyl ketal; and acridine derivatives such as 9-phenylacridine or 1,7-(9, 9'-acridinyl)heptane.

The content of the component (C) in the photosensitive resin composition is preferably from 0.1 parts by mass to 10 parts by mass, more preferably from 1 part by mass to 7 parts by mass, still more preferably from 2 parts by mass to 6 parts by mass, and even more preferably from 3 parts by mass to 5 parts by mass, with respect to 100 parts by mass of the total amount of the component (A) and the component (B). In a case in which the content of the component (C) is 0.1 parts by mass or more, excellent sensitivity, resolution, or adhesiveness can be easily obtained. In a case in which the content is 10 parts by mass or less, excellent resist shape can be easily obtained.

Component (D): Sensitizing Dye

The photosensitive resin composition includes at least one styryl pyridine represented by the Formula (1). A sensitizing dye as component (D) may be used singly, or in combination of two or more kinds thereof.

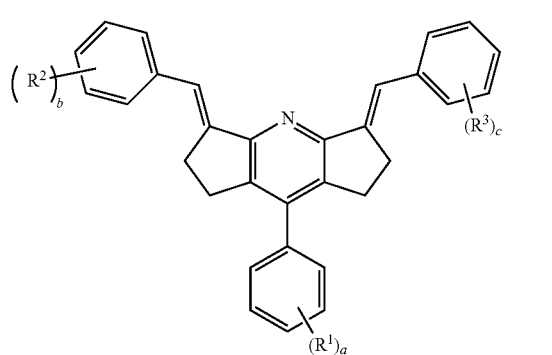

(1)

In Formula (1), each of R¹, R² and R³ independently represents an alkyl group having from 1 to 20 carbon atoms, an alkoxy group having from 1 to 6 carbon atoms, an alkyl ester group having from 1 to 6 carbon atoms, an amino group, an alkyl amino group having from 1 to 20 carbon atoms, a carboxy group, a ciano group, a nitro group, an acetyl group or a (meth)acryloyl group, each of a, b and c independently represents an integer of from 0 to 5. In a case in which a is 2 or more, the plural R¹s may be the same or different. In a case in which b is 2 or more, the plural R²s may be the same or different. In a case in which c is 2 or more, the plural R³s may be the same or different.

In terms of improving sensitivity, it is preferable that each of R¹, R² and R³ in Formula (1) is independently an alkyl group having from 1 to 20 carbon atoms, an alkoxy group having from 1 to 6 carbon atoms, an alkyl ester group having from 1 to 6 carbon atoms, an amino group, an alkyl amino group having from 1 to 20 carbon atoms.

Each of a, b and c independently represents an integer of from 0 to 5, preferably an integer of from 0 to 3, and more preferably an integer of from 0 to 2.

Examples of styryl pyridine represented by the Formula (1) include 3,5-dibenzylidene dicyclopentano [b,e]-4-phenyl pyridine, 3,5-bis (4-methylbenzylidene dicyclopentano [b,e])-4-(4-methylphenyl) pyridine, 3,5-bis(4-methoxybenzylidene dicyclopentano [b,e])-4-(4-methoxyphenyl) pyridine, 3,5-bis (4-aminobenzylidene dicyclopentano [b,e])-4-(4-aminophenyl) pyridine, 3,5-bis (4-dimethylaminobenzylidene dicyclopentano [b,e])-4-(4-dimethylphenyl) pyridine, 3,5-bis (4-carboxybenzylidene dicyclopentano [b,e])-4-(4-carboxyphenyl) pyridine, 3,5-bis (4-acetylbenzylidene dicyclopentano [b,e])-4-(4-acetylphenyl) pyridine, 3,5-bis(4-cianobenzylidene dicyclopentano [b,e])-4-(4-cianophenyl) pyridine, 3,5-bis(4-nitrobenzylidene dicyclopentano [b,e])-4-(4-nitrophenyl) pyridine, 3,5-bis(4-acryloylbenzylidene dicyclopentano [b,e])-4-(4-acryloylphenyl) pyridine, and 3,5-bis(2,4-dimethoxybenzylidene dicyclopentano [b,e])-4-(2,4-dimethoxyphenyl) pyridine.

The styryl pyridine represented by the Formula (1) can be synthesized, for example, by the condensation reaction of benzaldehyde derivatives, cyclic alkylketone and ammonium acetate.

The total content of the component (D) in the photosensitive resin composition is preferably from 0.01 parts to about 10 parts by mass, more preferably from 0.05 parts to about 5 parts by mass, and still more preferably from 0.08 parts to about 3 parts by mass, with respect to 100 parts by mass of the total amount of the component (A) and the component (B). In a case in which the content is 0.01 parts by mass or more, sufficient sensitivity and resolution can be easily obtained. In a case in which the content is 10 parts by mass or less, sufficiently excellent resist shape can be easily obtained.

Component (E): Amine Compound

The photosensitive resin composition preferably includes at least one amine compound as the component (E). Examples of the amine compound include bis[4-(dimethylamino)phenyl]methane, bis[4-(diethylamino)phenyl]methane, and leucocrystal violet. These may be used singly, or in combination of two or more kinds thereof.

In a case in which the photosensitive resin composition includes the component (E), the content thereof is preferably from 0.01 parts by mass to 10 parts by mass, more preferably from 0.05 parts to 5 parts by mass, and still more preferably from 0.1 parts by mass to 2 parts by mass, with respect to 100 parts by mass of the total amount of the component (A) and the component (B). In a case in which the content is 0.01 parts by mass or more, it will tend to become easier to obtain sufficient sensitivity. In a case in which the content is 10 parts by mass or less, excess component (E) tends to be inhibited from depositing as foreign matter after the formation of a film (photosensitive resin composition layer).

Other Components

The photosensitive resin composition may include, if necessary, the other components, for example, a photopolymerizable compound (such as an oxetane compound) having at least one cation polymerizable cyclic ether group in the molecule thereof; a cation polymerization initiator; a dye such as Malachite Green, Victoria Pure Blue, Brilliant Green, or Methyl Violet; a photochromic agent such as tribromophenylsulfone, diphenylamine, benzylamine, triphenylamine, diethylaniline, or 2-chloroaniline; a thermal development inhibitor; a plasticizer such as 4-toluenesulfonamide; a pigment; a filler; an antifoaming agent; a flame retardant; a stabilizing agent; a tackifier; a leveling agent; a release promoter; an antioxidant; perfume; an imaging agent; a thermal crosslinking agent; or the like. These compounds may be used singly, or in combination of two or more kinds thereof. In a case in which the photosensitive resin composition may include the other components, the content thereof is preferably from about 0.01 parts to about 20 parts by mass, with respect to 100 parts by mass of the total amount of the component (A) and the component (B).

Solution of Photosensitive Resin Composition

The photosensitive resin composition according to the present embodiment may further include at least one organic solvent. Examples of the organic solvent include alcohol solvents such as methanol or ethanol; ketone solvents such as acetone, or methyl ethyl ketone; glycol ether solvents such as methylcellosolve, ethylcellosolve, or propyleneglycol monomethyl ether; aromatic hydrocarbon solvents such as toluene; and aprotic polar solvents such as N,N-dimethylformamide. These solvents may be used singly, or in combination of two or more kinds thereof. The content of the organic solvent in the photosensitive resin composition can be appropriately selected depending on the purpose or the like. For example, the organic solvent may be used to give a solution with a solid content of from about 30% by mass to about 60% by mass. Hereinbelow, the photosensitive resin composition containing the organic solvent is sometimes referred to as "coating solution".

The photosensitive resin composition layer, which is a coating film of the photosensitive resin composition, can be formed by applying the coating solution onto a surface of a support described below, a metal plate or the like, and drying the resultant. The metal plate is not particularly limited and can be appropriately selected depending on the purpose or the like. Examples of the metal plate include plates of metal such as copper, a copper-based alloy, nickel, chromium, iron, and an iron-based alloy such as stainless steel. Preferable examples of the metal plate include copper, a copper-based alloy, and an iron-based alloy.

The thickness of the resulting photosensitive resin composition layer is not particularly limited and can be appropriately selected depending on the intended use or the like. For example, the thickness of the photosensitive resin composition layer is preferably from about 1 µm to about 100 µm after drying. In a case in which the photosensitive resin composition layer is formed on the metal plate, the surface opposite the metal plate in the photosensitive resin composition layer may be covered with a protective film. Examples of the protective film include polymer films such as polyethylene or polypropylene.

The photosensitive resin composition can be applied to the formation of a photosensitive resin composition layer of a photosensitive element described below. That is, another embodiment of the present invention is the application to a photosensitive element of a photosensitive resin composition including: component (A): a binder polymer having a structural unit derived from a hydroxyalkyl (meth)acrylate ester having a hydroxyalkyl group having from 1 to 12 carbon atoms, and a structural unit derived from a (meth) acrylic acid; component (B): a photopolymerizable compound having an ethylenically unsaturated bond group; component (C): a photopolymerization initiator; and component (D): a styryl pyridine represented by the Formula (1).

The photosensitive resin composition of the present embodiment can be used for the method for forming a resist pattern described below. That is, in another embodiment of the present invention is the application to a method for forming a resist pattern of a photosensitive resin composition including: component (A): a binder polymer having a structural unit derived from a hydroxyalkyl (meth)acrylate ester having a hydroxyalkyl group having from 1 to 12 carbon atoms, and a structural unit derived from a (meth) acrylic acid; component (B): a photopolymerizable compound having an ethylenically unsaturated bond group; component (C): a photopolymerization initiator; and component (D): a styryl pyridine represented by the Formula (1).

Photosensitive Element

The photosensitive element of the present invention has: a support; and a photosensitive resin composition layer that is provided on the support. The photosensitive resin composition layer is a coating layer formed using the above-described photosensitive resin composition, and is in an uncured state. The photosensitive element may, if necessary, have another layer such as a protective layer.

FIG. 1 shows an embodiment of a photosensitive element. The sizes of the members in FIG. 1 are shown conceptually, and relative sizes between members are not limited thereto.

In a photosensitive element 1 shown in FIG. 1, a support 2, a photosensitive resin composition layer 3, which is a coating film of the photosensitive resin composition, and a protective layer 4 are layered in this order. The photosensitive element 1 can be obtained, for example, as follows. That is, a coating solution, which is the photosensitive resin composition containing an organic solvent, is applied onto the support 2 to form a coating layer, and the resultant is dried to form the photosensitive resin composition layer 3. The surface opposite the support 2 in the photosensitive resin composition layer 3 is then covered with the protective layer 4, thereby obtaining the photosensitive element 1 according to the present embodiment provided with the support 2, the photosensitive resin composition layer 3 formed on or above the support 2, and the protective layer 4 layered on or above the photosensitive resin composition layer 3. The photosensitive element 1 is not necessarily provided with the protective layer 4.

As the support 2, a polymer film having heat resistance and solvent resistance, for example, polyester such as polyethylene terephthalate, polypropylene, or polyethylene may be used.

The thickness of the support 2 (polymer film) is preferably from 1 µm to 100 µm, more preferably from 5 µm to 50 µm, and still more preferably from 5 µm to 30 µm. In a case in which the thickness of the support 2 is 1 µm or more, tearing of the support 2 during releasing the support 2 can be suppressed. In a case in which the thickness is 100 µm or less, deterioration in resolution can be suppressed.

The protective layer 4 is preferably one whose adhesive force with respect to the photosensitive resin composition layer 3 is lower than the adhesive force of the support 2 with respect to the photosensitive resin composition layer 3. The protective layer 4 is preferably a low-fisheye film. The term "fisheye" as used here in mean inclusion of a foreign material, an undissolved material, an oxidatively degraded material, or the like of a raw material that has been taken into the film during manufacture of the film by thermal melting, kneading, extrusion, biaxially-stretching, or casting the raw material. That is, "low-fisheye" means that the film contains few foreign materials.

More specifically, the protective film 4 used here may be a film of a polymer having heat resistance and solvent resistance, for example, polyester such as polyethylene terephthalate, and polyolefin such as polypropylene and polyethylene. Examples of commercially available products thereof include ALPHAN MA-410 and E-200 manufactured by Oji Paper Co., Ltd.; a polypropylene film manufactured by Shin-Etsu Film Co., Ltd.; and a polyethylene terephthalate film of PS series such as PS-25 manufactured by Teij in Limited. The protective layer 4 may be the same material as the support 2.

The thickness of the protective layer 4 is preferably from 1 μm to 100 μm, more preferably from 5 μm to 50 μm, still more preferably from 5 μm to 30 μm, and even more preferably from 15 μm to 30 μm. In a case in which the thickness of the protective layer 4 is 1 μm or more, tearing of the protective layer 4 during laminating the photosensitive resin composition layer 3 and the support 2 on the substrate while releasing the protective layer 4 can be suppressed. In a case in which the thickness of the protective layer 4 is 100 μm or less, excellent handleability and low cost can be achieved.

More specifically, the photosensitive element according to the present embodiment can be manufactured, for example, as follows. That is, the photosensitive element can be manufactured by the manufacture method that includes a process of preparing a coating solution in which component (A): a binder polymer; component (B): a photopolymerizable compound; component (C): a photopolymerization initiator; and component (D): a sensitizing dye are dissolved in the organic solvent; a process of forming a coating layer by applying the coating solution to a support 2; and a process of drying the resultant to form the photosensitive resin composition layer 3.

The coating of the solution of the photosensitive resin composition to the support 2 may be carried out by a known method such as roll coating, comma coating, gravure coating, air knife coating, die coating, or bar coating.

The drying condition of the coating layer is not particularly limited as long as at least a part of the organic solvent can be removed from the coating layer. The drying is preferably carried out at from 70° C. to 150° C. for about 5 minutes to about 30 minutes. The amount of the residual organic solvent in the photosensitive resin composition layer 3 after drying is preferably 2% by mass or less from the viewpoint of preventing diffusion of the organic solvent in subsequent processes.

The thickness of the photosensitive resin composition layer 3 in the photosensitive element can be appropriately selected depending on the intended use. The post-drying thickness is preferably from 1 μm to 100 μm, more preferably from 1 μm to 50 μm, and still more preferably from 5 μm to 40 μm. In a case in which the thickness of the photosensitive resin composition layer 3 is 1 μm or more, industrial coating can be easily carried out. In a case in which the thickness of the photosensitive resin composition layer 3 is 100 μm or less, sufficient adhesiveness and resolution can be easily obtained.

The transmittance of ultraviolet rays through the photosensitive resin composition layer 3 is preferably from 5% to 75%, more preferably from 10% to 65%, and still more preferably from 15% to 55%, with respect to ultraviolet rays with a wavelength of from 350 nm to 420 nm. In a case in which the transmittance is 5% or more, sufficient adhesiveness can be easily obtained. In a case in which the transmittance is 75% or less, sufficient resolution can be easily obtained. The transmittance can be measured by a UV spectrometer. Examples of the UV spectrometer used here include a type 228A double beam spectrometer (manufactured by Hitachi, Ltd).

The photosensitive element may further include an intermediate layer such as a cushion layer, an adhesion layer, a light absorbing layer, or a gas barrier layer. For example, the intermediate layer described in JP-A No. 2006-098982 may be applied to the intermediate layer.

The shape of the resulting photosensitive element is not particularly limited. The photosensitive element may be a sheet form, or may be rewound into a roll shape around a core. In a case in which the photosensitive element is rewound into a roll shape, it is preferable to rewind the element such that the support 2 faces outside. Examples of the material for the core include plastics such as a polyethylene resin, a polypropylene resin, a polystyrene resin, a polyvinyl chloride resin, or an ABS resin (acrylonitrile-butadiene-styrene copolymer). On the edge of the photosensitive element roll thus obtained, it is preferable to provide an edge separator from the viewpoint of edge protection, and it is preferable to provide a moisture-proof edge separator from the viewpoint of edge fusion resistance. As the packing method, a black sheet with low moisture permeability is preferably used to pack.

The photosensitive element according to the present embodiment can be used, for example, in the method for producing a substrate with a resist pattern described below.

Method for Producing Substrate with Resist Pattern

The photosensitive resin composition can be used to produce a substrate with a resist pattern. The present method for producing a substrate with a resist pattern, the method includes: (i) forming a photosensitive resin composition layer on a substrate using the above-mentioned photosensitive resin composition (Photosensitive Layer Forming Process); (ii) irradiating at least a part of an area of the photosensitive resin composition layer with active light rays, and photo-curing the area to form a cured material area (Exposure process); and (iii) removing an area other than the cured material area of the photosensitive resin composition layer from the substrate to form a resist pattern, which is the cured material area, on the substrate (Developing Process). The method for producing the substrate with the resist pattern may further include other processes, if necessary.

(i) Photosensitive Layer Forming Process

First, the photosensitive resin composition layer 3 is formed on a substrate using the photosensitive resin composition. The substrate used here may be a substrate (a substrate for forming circuits) provided with an insulating layer and a conductor layer formed on the insulating layer. The insulating layer includes a glass epoxy material. The conductor layer includes a copper foil.

In a case in which the photosensitive element has the protective layer 4, the photosensitive resin composition layer 3 is formed on the substrate by removing the protective layer 4 and then pressure bonding the photosensitive resin composition layer 3 of the photosensitive element to the substrate while heating. As a result, a resulting layered body in which the substrate, the photosensitive resin composition layer 3 and the support 2 are layered in this order can be obtained.

The photosensitive layer forming process is preferably carried out under reduced pressure from the viewpoint of adhesiveness and follow-up property. The temperature of applying heat to at least one of the photosensitive resin composition layer 3 and the substrate during contact bonding is preferably from 70° C. to 130° C., and the contact bonding pressure thereof is preferably from about 0.1 MPa to about 1.0 MPa (about 1 kgf/cm$^2$ to about 10 kgf/cm$^2$). These conditions are not particularly limited, and are appropriately selected as needed. In a case in which the photosensitive resin composition layer 3 is heated at from 70° C. to 130° C., it may be not necessary to subject the substrate to preheating in advance. However, preheating of the substrate for forming circuits can further improve adhesiveness and follow-up property.

(ii) Exposure Process

In the exposure process, at least a part of an area of the photosensitive resin composition layer 3 thus formed on the substrate is irradiated with active light rays to photo-cure the area irradiated with active light rays, thereby forming a latent image. In a case in which the support 2 on the photosensitive resin composition layer 3 transmits active light rays, it is possible to irradiate active light lays through the support 2. On the other hand, in a case in which the support 2 blocks active light lays, the support 2 is removed and then the photosensitive resin composition layer 3 is irradiated with active light rays.

Examples of the method of exposure include a method of irradiating active light rays imagewise through a negative or positive mask pattern, which is referred to as artwork (mask exposure method). Alternatively, a method for irradiating active light rays imagewise by a direct writing exposure method such as LDI (Laser Direct Imaging) exposure method or DLP (Digital Light Processing) exposure method may be used.

The light source of the active light rays is not particularly limited, and may be a known light source. Examples of the light source include gas lasers such as a carbon arc lamp, a mercury vapor arc lamp, an ultra-high-pressure mercury lamp, a xenon lamp, or an argon laser; solid lasers such as a YAG laser; semiconductor lasers; gallium nitride-based violet lases, which efficiently emits ultraviolet rays, visible light or the like.

The wavelength of the active light rays (exposure wavelength) is preferably in a range of from 340 nm to 430 nm, and more preferably 350 nm to 420 nm, from the viewpoint of achieving the effect of the present invention more reliably.

(iii) Developing Process

In the developing process, an uncured area of the photosensitive resin composition layer 3 is removed from the substrate for forming circuits through a development treatment, thereby forming a resist pattern, which is a cured material obtained by photo-curing the photosensitive resin composition layer 3, on the substrate. In a case in which the support 2 remains on the photosensitive resin composition layer 3, the support 2 is removed and then the unexposed area is removed (developed). Examples of the development process include wet development and dry development, and the wet development is widely used.

In the case of wet development, a developing solution suitable for the photosensitive resin composition is used and development is achieved by a known development method. Examples of the development method include a dip method, a paddle method, a spray method, brushing, slapping, scrapping, and dipping while shaking. From the viewpoint of improving resolution, a high-pressure spray method is suitable. The development may be carried out by combining two or more of these methods.

The developing solution is appropriately selected depending on the components of the photosensitive resin composition. Examples of the developing solution include an aqueous alkali solution and an organic solvent developing solution.

The aqueous alkali solution used as the developing solution is safe and stable and has excellent handlebility. Examples of bases to be used for the aqueous alkali solution include alkali hydroxides such as hydroxides of a lithium, sodium or potassium; alkali carbonates such as a carbonate or bicarbonate of lithium, sodium, potassium or ammonium; alkali metal phosphates such as potassium phosphate or sodium phosphate; and alkali metal pyrophosphate such as sodium pyrophosphate or potassium pyrophosphate; borax (sodium tetraborate), sodium metasilicate, tetramethylammonium hydroxide, ethanolamine, ethylenediamine, diethylenetriamine, 2-amino-2-hydroxymethyl-1,3-propanediol, 1,3-propanediol, 1,3-diamino-2-propanol and morpholine.

The aqueous alkali solution used as the developing solution is preferably a 0.1% by mass to 5% by mass sodium carbonate dilute solution, a 0.1% by mass to 5% by mass potassium carbonate dilute solution, a 0.1% by mass to 5% by mass sodium hydroxide dilute solution, or a 0.1% by mass to 5% by mass sodium tetraborate dilute solution. The pH of the aqueous alkali solution is preferably in a range of from 9 to 11. The temperature is adjusted in accordance with the alkali developing property of the photosensitive resin composition layer 3. The aqueous alkali solution may contain a surfactant, an antifoaming agent, a small amount of an organic solvent to accelerate development, or the like.

The aqueous alkali solution may include one or more organic solvent. Examples of the organic solvent used include acetone, ethyl acetate, an alkoxyethanols having alkoxy group of from 1 to 4 carbon atoms, ethyl alcohol, isopropyl alcohol, butyl alcohol, diethylene glycol monomethyl ether, diethylene glycol monoethyl ether, and diethylene glycol monobutyl ether. These solvents may be used singly, or in combination of two or more kinds thereof. In general, the content ratio of the organic solvent in the aqueous developing solution is preferably from 2% by mass to 90% by mass. The temperature of the organic solvent may be adjusted depending on the alkali developing property.

Examples of the organic solvent used for the organic solvent developing solution include 1,1,1-trichloroethane, N-methylpyrrolidone, N,N-dimethylformamide, cyclohexanone, methyl isobutyl ketone, and γ-butyrolactone. For anti-inflammability, it is preferable to add water to at least one of these organic solvents in a range of from 1% by mass to 20% by mass to prepare the organic solvent developing solution.

As needed, the method for producing a substrate with a resist pattern may further include a process of heating at about 60° C. to 250° C. or exposing at about 0.2 J/cm$^2$ to 10 J/cm$^2$ after the removal of the unexposed area to further cure the resist pattern.

Method for Producing Printed Wiring Board

The method for producing a printed wiring board, the method may include a process of subjecting the above-described substrate with the resist pattern which has been formed using the method for producing a substrate with a resist pattern, to at least one of etching or plating. Preferable example of the substrate is a substrate for forming circuits, which has an insulating layer and a conductor layer formed on the insulating layer. As needed, the method for producing a printed wiring board may include another process such as a resist removing process. The conductor layer or the like of the substrate is treated by etching or plating using the developed resist pattern as a mask.

In the etching treatment, using a resist pattern (cured resist) formed on the substrate as a mask, an areas of the conductor layer of the substrate for forming circuits, the area being not covered with the cured resist, is removed by etching to form the conductor pattern. The method for etching is appropriately selected depending on components of the conductor layer to be removed. Examples of etching solutions include a cupric chloride solution, a ferric chloride solution, an alkali etching solution, and a hydrogen peroxide etching solution. Among these, it is preferable to use the ferric chloride solution in view of sufficient etch factor.

In the plating treatment, using a resist pattern (cured resist) formed on the substrate as a mask, cupper, a solder and the like are plated on areas of the conductor layer of the substrate for forming circuits, the areas which is not covered with the cured resist. After plating, the cured resist is removed, and then the conductor layer that has been covered with the cured resist is subjected to etching, thereby forming the conductor pattern. The plating may be electrolytic plating, or non-electrolytic plating. Examples of the plating include copper plating such as copper sulfate plating or copper pyrophosphate plating; solder plating such as high throwing solder plating; nickel plating such as Walt bath (nickel sulfate-nickel chloride) plating or nickel sulfaminate plating; and gold plating such as hard gold plating or soft gold plating.

The resist pattern on the substrate is removed (released) after the etching and plating. For example, the removal of the resist pattern may be achieved with an aqueous solution of stronger alkalinity than the aqueous alkali solution used in the developing process. The strong alkaline aqueous solution used here may be a 1% by mass to 10% by mass sodium hydroxide aqueous solution or a 1% by mass to 10% by mass potassium hydroxide aqueous solution. Among these, it is preferable to use a 1% by mass to 10% by mass sodium or potassium hydroxide aqueous solution, and more preferable to use a 1% by mass to 5% by mass sodium hydroxide aqueous solution or potassium hydroxide aqueous solution. Examples of the method of applying the aqueous alkali solution include a dipping method and a spraying method, and these methods are used singly or in combination of two or more kinds thereof.

In a case in which the resist pattern is removed after plating, the conductor layer that has been covered with the cured resist can be further removed by etching to form the conductor pattern, whereby the intended printed wiring board can be manufactured. The etching method is appropriately selected depending on components of the conductor layer to be removed. For example, the above-described etching solution can be used.

The method for producing the printed wiring board according to the present invention may be applied to manufacture of not only single-layer printed wiring boards but also multilayer printed wiring boards, and may be applied to manufacture of printed boards with miniature through-holes.

The photosensitive resin composition according to the present embodiment can be used suitably for the production of a wiring board. That is, one of the preferable embodiments of the present invention is the application to the production of a printed wiring board of a photosensitive resin composition including: component (A) a binder polymer having a structural unit derived from a hydroxyalkyl (meth)acrylate ester having a hydroxyalkyl group having from 1 to 12 carbon atoms, and a structural unit derived from a (meth)acrylic acid; component (B) a photopolymerizable compound having an ethylenically unsaturated bond group; component (C) a photopolymerization initiator; and component (D) a styryl pyridine represented by the Formula (1). A more preferable embodiment is the application of the above-mentioned photosensitive resin composition to the production of a high density package substrate and the application of the photosensitive resin composition to a semi-additive process. One example of a process of the production of a wiring board by a semi-additive process is explained below with reference to FIG. 2. Size of members in FIG. 2 is conceptionally shown, and relative size between members is not limited thereto.

Figure 2:
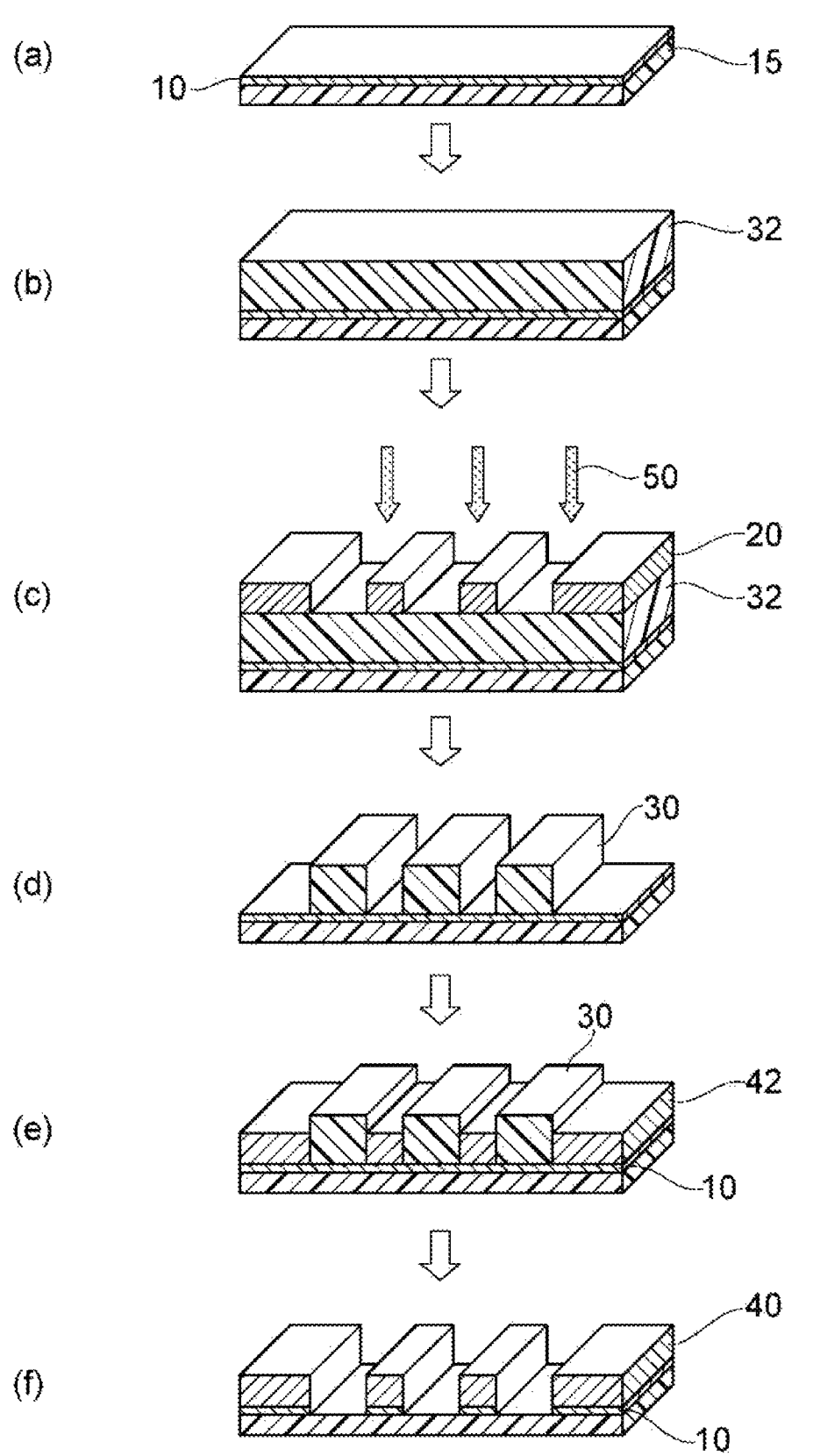
FIG. 2 is schematic perspective views illustrating an example of a producing method of a printed wiring board using a semi-additive process.

FIG. 2(a) shows the preparation of a substrate (substrate for forming circuits) in which a conductor layer 10 is formed on an insulating layer 15. The conductor layer 10 is, for example, a metal copper layer. FIG. 2(b) shows the formation of a photosensitive resin composition layer 32 on the conductor layer 10 of the substrate by the photosensitive layer forming process. FIG. 2(c) shows the formation of a photo-cured area by arranging a mask 20 on the photosensitive resin composition layer 32 and exposing an area other than the area on which the mask 20 is arranged by irradiation of an active light ray 50. FIG. 2(d) shows the formation of a resist pattern 30 as the photo-cured area on the substrate by removal of the area other than the photo-cured area formed by the exposure process from the substrate. FIG. 2(e) shows the formation of a plated layer 42 on the conductor layer 10 by plate processing using as a mask the resist pattern 30 of the photo-cured area. FIG. 2(f) shows the formation of a circuit pattern 40 by releasing the resist pattern 30 of the photo-cured area with a strong alkaline aqueous solution followed by etching to remove a part of the plated layer 42 and the conductor layer 10 that has been masked with the resist pattern 30. The material of the conductor layer 10 and a material of the plated layer 42 may be same or different. In case in which the material of the conductor layer 10 and a material of the plated layer 42 is same, the conductor layer 10 may be unified with the plated layer 42. In FIG. 2, the method for forming the resist pattern 30 using the mask 20 is illustrated. However, the resist pattern 30 may be formed by a direct writing exposure method without using the mask 20.

EXAMPLES

The present invention is described below more specifically with reference to Examples, but the present invention is not limited to these examples.

Example 1

Preparation of Solution of Photosensitive Resin Composition

Each of solutions of photosensitive resin compositions of Examples 1 to 4 and Comparative Examples 1 to 7 was prepared by mixing components (A) to (E) and a dye shown in Tables 2 and 3 in compounding amounts (unit: g) shown in the tables with 9 g of acetone, 5 g of toluene, and 5 g of methanol. The compounding amount of the component (A) shown in Tables 2 and 3 is mass of non-volatile content (amount of solid content). The "non-volatile content" refers to a component other than volatile material in the compound.

The "volatile material" refers to a material having a boiling point of 170° C. or lower at atmospheric pressure. The details of respective components shown in Tables 2 and 3 are as follows. Here, "-" in Tables 2 and 3 means that the component is not contained.

(A) Binder Polymer [Synthesis of Binder Polymer (A-1)]

81 g of methacrylic acid, 15 g of 2-hydroxyethyl methacrylate, 135 g of styrene, and 69 g of benzyl methacrylate (mass ratio: 27/5/45/23) as polymerizable monomers (monomers) were mixed with 1.5 g of azobisisobutyronitrile, thereby obtaining a solution as "solution a".

0.5 g of azobisisobutyronitrile was dissolved in 100 g of a mixture of 60 g methylcellosolve and 40 g toluene (mass ratio of 3:2), thereby obtaining a solution as "solution b".

In a flask equipped with a stirrer, a reflux condenser, a thermometer, a dropping funnel, and a nitrogen gas inlet tube, 300 g of a mixture of 180 g methylcellosolve and 120 g toluene (mass ratio of 3:2) was added, and the mixture was stirred while blowing nitrogen gas into the flask and heated to 80° C.

The solution a was added dropwise to the mixture in the flask over a period of 4 hours, and then the resultant was kept for 2 hours at 80° C. while stirring. Subsequently, solution b was added dropwise to the mixture in the flask over a period of 10 minutes, and then the resultant was kept for 3 hours at 80° C. while stirring. The solution in the flask was then heated to 90° C. over a period of 30 minutes. The resultant was kept for 2 hours at 90° C. and then cooled, thereby obtaining a solution of a binder polymer (A-1).

Synthesis of Binder Polymer (A-2)

A solutions of binder polymer (A-2) was obtained in a manner similar to the method for obtaining the solution of the binder polymer (A-1), except that materials shown in Table 1 was used in amounts shown in Table 1.

Synthesis of comparative Binder Polymers (A-3)

A solution of comparative binder polymer (A-3) was obtained in a manner similar to the method for obtaining the solution of the binder polymer (A-1), except that 72 g of methacrylic acid, 9 g of methyl methacrylate, 150 g of styrene, and 69 g of benzyl methacrylate (mass ratio: 24/3/50/23) as polymerizable monomers (monomers) were mixed with 1.5 g of azobisisobutyronitrile to obtain a solution as "solution c", and the solution c was used instead of the solution a.

Synthesis of comparative Binder Polymers (A-4)

A solution of comparative binder polymer (A-4) was obtained in a manner similar to the method for obtaining the solution of the binder polymer (A-1), except that 90 g of methacrylic acid, 150 g of styrene, and 60 g of benzyl methacrylate (mass ratio: 30/50/20) as polymerizable monomers (monomers) were mixed with 1.5 g of azobisisobutyronitrile to obtain a solution as "solution d", and the solution d was used instead of the solution a.

With regard to the binder polymers (A-1) to (A-4), the mass ratio (%) of the polymerizable monomers (monomers), the acid value, the weight-average molecular weight and the dispersivity are shown in Table 1.

TABLE 1

| | Methacrylic acid | 2-hydroxyethyl methacrylate | Styrene | Benzyl methacrylate | Methyl methacrylate | Acid value (mg/KOH) | Weight-average molecular weight | Dispersivity |
|---|---|---|---|---|---|---|---|---|
| (A-1) | 27 | 5 | 45 | 23 | 0 | 176 | 27000 | 1.8 |
| (A-2) | 24 | 3 | 50 | 23 | 0 | 157 | 26000 | 1.7 |
| (A-3) | 24 | 0 | 50 | 23 | 3 | 157 | 28000 | 1.7 |
| (A-4) | 30 | 0 | 50 | 20 | 0 | 196 | 27000 | 1.7 |

With regard to the binder polymer (A-1), the non-volatile content (solid content) was 41.5% by mass, the weight-average molecular weight was 27,000, the acid value was 176 mgKOH/g, and the dispersivity was 1.8.

The weight-average molecular weight was measured by gel permeation chromatography (GPC) and calculation was performed using a standard polystyrene calibration curve. The GPC conditions were as follows.

GPC Conditions
Pump: Hitachi L-6000 (manufactured by Hitachi, Ltd.)
Column: the following three columns, column specifications: 10.7 mmΦ×300 mm
  Gelpack GL-R440;
  Gelpack GL-R450; and
  Gelpack GL-R400M (all manufactured by Hitachi Chemical Co., Ltd)
Eluent: tetrahydrofuran (THF)
Sample concentration: 120 mg of the binder polymer solution with a solid content of 40% by mass was measured off and dissolved in 5 mL of THF to prepare a sample.
Measuring temperature: 40° C.
Charged amount: 200 μL
Pressure: 49 Kgf/cm$^2$ (4.8 MPa)
Flow rate: 2.05 mL/min
Detector: Hitachi L-3300 RI (manufactured by Hitachi, Ltd.)

(B) Photopolymerizable Compound

FA-324M (manufactured by Hitachi Chemical Co., Ltd., trade name): 2,2-bis(4-(methacryloxy diethoxy)phenyl)propane FA-3200MY (manufactured by Hitachi Chemical Co., Ltd., trade name): 2,2-bis(4-(methacryloxy ethoxypropoxy) phenyl)propane (an adduct of an average of 12 moles of ethyleneoxide and an average of 4 moles of propyleneoxide)

FA-321M (manufactured by Hitachi Chemical Co., Ltd., trade name): 2,2-bis(4-(methacryloxy pentaethoxy)phenyl) propane (C) Photopolymerization Initiator B-CIM (manufactured by Hampford Co., trade name): 2,2'-bis(2-chlorophenyl)-4,4',5,5'-tetraphenylbisimidazole [2-(2-chlorophenyl)-4,5-diphenylimidazole dimer]

(D) Sensitizing Dye 2,4-DMOP-DSP (synthesis sample name): 3,5-bis(2,4-dimethoxybenzylidene dicyclopentano [b,e])-4-(2,4-dimethoxyphenyl) pyridine PYR-1 (manufactured by Nippon Chemical Industrial Co., Ltd.): 1-phenyl-3-(4-methoxystyryl)-5-(4-methoxyphenyl)pyrazoline EAB (manufactured by Hodogaya Chemical Co., Ltd. trade name): 4,4'-diethylaminobenzophenone (E) Amine compound
LCV (manufactured by Yamada Chemical Co., Ltd., trade name): Leuco crystal violet
Dye
MKG: (manufactured by Osaka Organic Chemistry, Ltd., trade name): Malachite Green

TABLE 2

|     | Component | Example 1 | Example 2 | Example 3 | Example 4 |
|-----|-----------|-----|-----|-----|-----|
| (A) | (A-1)     | 51  | 56  | —   | —   |
|     | (A-2)     | —   | —   | 51  | 56  |
|     | (A-3)     | —   | —   | —   | —   |
|     | (A-4)     | —   | —   | —   | —   |
| (B) | FA-324M   | 29  | 20  | 29  | 20  |
|     | FA-3200MY | 20  | 10  | 20  | 10  |
|     | FA-321M   | —   | 14  | —   | 14  |
| (C) | B-CIM     | 4   | 4   | 4   | 4   |
| (D) | 2,4-DMOP-DSP | 0.1 | 0.1 | 0.1 | 0.1 |
|     | PYR-1     | —   | —   | —   | —   |
|     | EAB       | —   | —   | —   | —   |
| (E) | LCV       | 0.65 | 0.65 | 0.65 | 0.65 |
| Dye | MKG       | 0.03 | 0.03 | 0.03 | 0.03 |

TABLE 3

|     | Component | Comp. 1 | Comp. 2 | Comp. 3 | Comp. 4 | Comp. 5 | Comp. 6 | Comp. 7 |
|-----|-----------|----|----|----|----|----|----|----|
| (A) | (A-1)     | 51 | 51 | 56 | —  | —  | —  | —  |
|     | (A-2)     | —  | —  | —  | 51 | —  | —  | —  |
|     | (A-3)     | —  | —  | —  | —  | 51 | —  | 56 |
|     | (A-4)     | —  | —  | —  | —  | —  | 51 | —  |
| (B) | FA-324M   | 29 | 29 | 20 | 29 | 29 | 29 | 20 |
|     | FA-3200MY | 20 | 20 | 10 | 20 | 20 | 20 | 10 |
|     | FA-321M   | —  | —  | 14 | —  | —  | —  | 14 |
| (C) | B-CIM     | 4  | 4  | 4  | 4  | 4  | 4  | 4  |
| (D) | 2,4-DMOP-DSP | — | — | — | — | 0.1 | 0.1 | — |
|     | PYR-1     | 0.1 | — | 0.1 | 0.1 | — | — | 0.1 |
|     | EAB       | — | 0.1 | — | — | — | — | — |
| (E) | LCV       | 0.65 | 0.65 | 0.65 | 0.65 | 0.65 | 0.65 | 0.65 |
| Dye | MKG       | 0.03 | 0.03 | 0.03 | 0.03 | 0.03 | 0.03 | 0.03 |

Manufacture of Photosensitive Element

Each of the solutions of photosensitive resin composition obtained above was applied onto a polyethylene terephthalate film with a thickness of 16 μm("FB-40", manufactured by Toray Industries, Inc.) (support) and subsequently dried at 70° C. and 110° C. in this order with a hot air current drier, thereby forming a photosensitive resin composition layer with a post-drying thickness of 25 μm. A polypropylene film ("E-200K", manufactured by Oji Paper Co., Ltd.) (protective layer) was attached onto the photosensitive resin composition layer, thereby obtaining a photosensitive element including the support, the photosensitive resin composition layer, and the protective layer layered in this order.

Manufacture of Multilayer Substrate

The copper-clad laminate ("MCL-E-679F", manufactured by Hitachi Chemical Co., Ltd.) including a glass epoxy material and a copper foil (thickness: 16 μm) formed on both sides of the glass epoxy material (hereinafter, also referred to as "substrate") was heated to raise the temperature to 80° C. Subsequently, using each of the photosensitive elements of Examples 1 to 4 and Comparative Examples 1 to 7, the photosensitive layer was layered (laminated) on the copper surface of the substrate. The lamination was accomplished under conditions with a temperature of 120° C. and a lamination pressure of 4 kgf/cm$^2$ (0.4 MPa) while removing the protective layer, such that the photosensitive resin composition layer of each photosensitive element was closely bonded to the copper surface of the substrate. Thus, a multilayer substrate including the photosensitive resin composition layer and the support layered on the copper surface of the substrate was obtained.

The obtained multilayer substrate was allowed to cool to 23° C. Subsequently, a phototool having a 41-step tablet with a density region of from 0.00 to 2.00, a density step of 0.05, a tablet size of 20 mm×187 mm, and a size of each step of 3 mm×12 mm, was arranged on the support of the multilayer substrate. A direct writing exposure machine ("DE-1UH", manufactured by Hitachi Via Mechanicals, Ltd.) employing a violet laser diode with a wavelength of 405 nm as the light source was used for exposure of the photosensitive resin composition layer through the phototool and the support, at an energy dose (exposure dose) of 100 mJ/cm$^2$. The measurement of illuminance was performed using an ultraviolet illuminometer employing a 405 nm-responding probe ("UIT-150", manufactured by Ushio Inc.).

Evaluation of Sensitivity

Following the exposure, the support was released from the multilayer substrate to lay bare the photosensitive resin composition layer, and 1% by mass aqueous sodium carbonate at 30° C. was sprayed for 60 seconds thereto, thereby removing unexposed areas. Thus a resist pattern including a cured photosensitive resin composition on the copper surface of the substrate was formed. The number of remaining steps of the step tablet (step number) obtained as the resist pattern (cured film) was then counted to evaluate the sensitivity of the photosensitive resin composition. The sensitivity is represented by an energy dose (units: mJ/cm$^2$) so that remaining steps are 14 steps, with a smaller number of steps indicating more satisfactory sensitivity. The results are shown in Tables 4 and 5.

Evaluation of Resolution and Adhesiveness

A drawing with a line width (L)/space width (S) (hereinafter, referred to as "L/S") of from 3/3 to 30/30 (units: μm) was used for exposure (drawing) of the photosensitive resin composition layer on the multilayer substrate at an energy dose for 14 steps remaining on the 41-step tablet. Following the exposure, developing treatment was carried out in the same manner as for the evaluation of sensitivity described above.

After the development, the resolution and adhesiveness were evaluated by the minimum value among the line width/space width values for resist patterns with cleanly removed space areas (unexposed areas), and without meandering or defecting of the line areas (exposed areas). A smaller numerical value indicates more satisfactory resolution and adhesiveness. The resulting resist pattern was observed with a microscope at magnification ratio of 1000-fold, and confirmed the presence or absence of defectings. The results are shown in Tables 4 and 5.

TABLE 4

| Item | Example 1 | Example 2 | Example 3 | Example 4 |
|------|-----|-----|-----|-----|
| Sensitivity (mJ/cm$^2$) | 100 | 100 | 100 | 100 |
| Resolution (μm) | 8 | 8.5 | 8 | 8 |
| Adhesiveness (μm) | 9 | 8.5 | 9 | 8 |

TABLE 5

| Item | Comparative Example | | | | | | |
|---|---|---|---|---|---|---|---|
| | 1 | 2 | 3 | 4 | 5 | 6 | 7 |
| Sensitivity (mJ/cm$^2$) | 115 | 115 | 110 | 110 | 100 | 100 | 115 |
| Resolution (μm) | 9 | 10 | 9 | 9 | 9 | 12 | 12 |
| Adhesiveness (μm) | 10 | 10 | 11 | 10 | 10 | 12 | 12 |

As is clear from Tables 4 and 5, the resist patterns formed from the photosensitive resin compositions including: a binder polymer having a structural unit derived from a hydroxyalkyl (meth)acrylate ester having a hydroxyalkyl group having from 1 to 12 carbon atoms, and a structural unit derived from a (meth)acrylic acid; a photopolymerizable compound having an ethylenically unsaturated bond group; a photopolymerization initiator; and a styryl pyridine represented by the Formula (1) were excellent in all of sensitivity, resolution and adhesiveness.

The disclosure of Japanese Patent Application No. 2014-190158 is incorporated here in by reference in its entirety.

All publications, patent applications, and technical standards mentioned in the present specification are here in incorporated by reference to the same extent as if each individual publication, patent application, or technical standard was specifically and individually indicated to be incorporated by reference.

The invention claimed is:

1. A photosensitive resin composition, comprising:
(A) a binder polymer having a structural unit derived from a hydroxyalkyl (meth)acrylate ester having a hydroxyalkyl group having from 1 to 12 carbon atoms, and a structural unit derived from a (meth)acrylic acid, the binder polymer having a weight-average molecular weight (Mw) ranging from 10,000 to 15,000;
(B) a photopolymerizable compound having an unsaturated bond group, the (B) photopolymerizable compound comprising a structure represented by the following Formula (3):

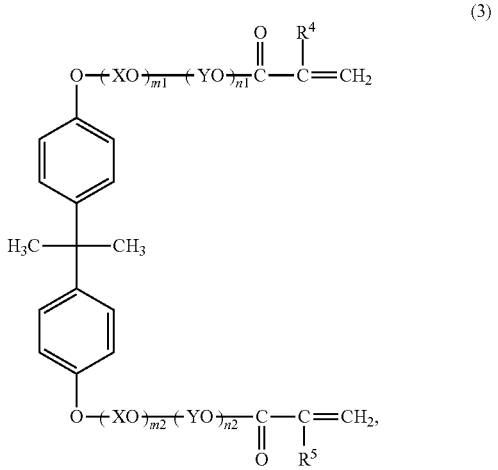

(3)

wherein, in Formula (3), each of $R^4$ and $R^5$ independently represents a hydrogen atom or a methyl group, each of $m_1$, $m_2$, $n_1$ and $n_2$ independently represents an integer of 0 or more, the total of $m_1+m_2+n_1+n_2$ is greater than 0, each of XO and YO independently represents an ethyleneoxy group or a propyleneoxy group, and the photopolymerizable compound includes at least one selected from a propyleneoxy group or a polypropyleneoxy group;
(C) a photopolymerization initiator; and
(D) a styryl pyridine represented by the Formula (1);

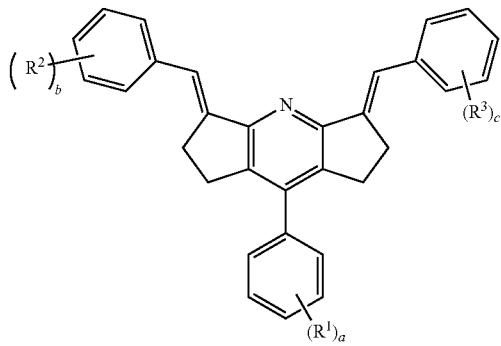

(1)

wherein, in Formula (1), each of $R^1$, $R^2$ and $R^3$ independently represents an alkyl group having from 1 to 20 carbon atoms, an alkoxy group having from 1 to 6 carbon atoms, an alkyl ester group having from 1 to 6 carbon atoms, an amino group, an alkyl amino group having from 1 to 20 carbon atoms, a carboxy group, a ciano group, a nitro group, an acetyl group or a (meth)acryloyl group, each of a, b and c independently represents an integer of from 0 to 5, with the proviso that when a is 2 or more, the plural $R^1$s are the same or different, when b is 2 or more, the plural $R^2$s are the same or different, and when c is 2 or more, the plural $R^3$s are the same or different.

2. The photosensitive resin composition according to claim 1, wherein (A) the binder polymer further has a structural unit derived from styrene or α-methylstyrene.

3. The photosensitive resin composition according to claim 1, wherein (C) the photopolymerization initiator includes at least one selected from the group consisting of 2,4,5-triarylimidazole dimer and a derivative thereof.

4. A photosensitive element, comprising:
a support; and
a photosensitive resin composition layer that is provided on the support and that is formed from the photosensitive resin composition according to claim 1.

5. A method for producing a substrate with a resist pattern, the method comprising:
forming a photosensitive resin composition layer on a substrate using the photosensitive resin composition according to claim 1;
irradiating at least a part of an area of the photosensitive resin composition layer with active light rays, and photo-curing the area to form a cured material area; and
removing an area other than the cured material area of the photosensitive resin composition layer from the substrate to form a resist pattern, which is the cured material area, on the substrate.

6. The method for producing a substrate with a resist pattern according to claim 5, wherein the active light rays have a wavelength in a range of from 340 nm to 430 nm.

7. A method for producing a printed wiring board, the method comprising:

subjecting the substrate with the resist pattern which has been formed using the method for producing a substrate with a resist pattern according to claim 5, to at least one of etching or plating.

8. The photosensitive resin composition according to claim 1, wherein each of $m_1$, $m_2$, $n_1$ and $n_2$ independently represents an integer of 0 to 40.

9. A multilayer substrate comprising:
a copper-clad laminate comprising:
  a glass epoxy material, and
  copper foil formed on both sides of the glass epoxy material; and
a photosensitive element comprising:
  a support, and
  a photosensitive resin composition layer provided on the support, the photosensitive resin composition layer contacting the copper foil on a side of the copper-clad laminate, the photosensitive resin composition layer including a photosensitive resin composition comprising:
(A) a binder polymer having a structural unit derived from a hydroxyalkyl (meth)acrylate ester having a hydroxyalkyl group having from 1 to 12 carbon atoms, and a structural unit derived from a (meth)acrylic acid, the binder polymer having a weight-average molecular weight (Mw) ranging from 10,000 to 15,000;
(B) a photopolymerizable compound having an unsaturated bond group, the (B) photopolymerizable compound comprising a structure represented by the following Formula (3):

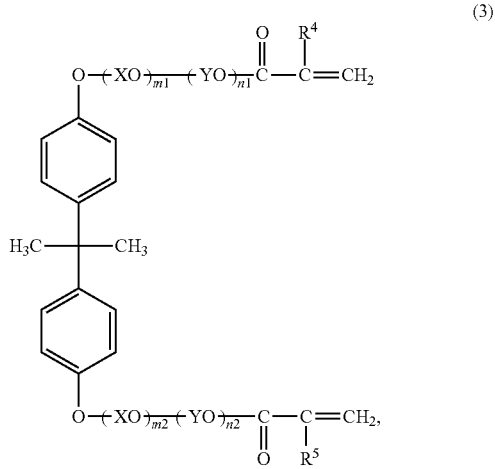

wherein, in Formula (3), each of $R^4$ and $R^5$ independently represents a hydrogen atom or a methyl group, each of $m_1$, $m_2$, $n_1$ and $n_2$ independently represents an integer of 0 or more, the total of $m_1+m_2+n_1+n_2$ is greater than 0, each of XO and YO independently represents an ethyleneoxy group or a propyleneoxy group, and the photopolymerizable compound includes at least one selected from a propyleneoxy group or a polypropyleneoxy group;

(C) a photopolymerization initiator; and
(D) a styryl pyridine represented by the Formula (1);

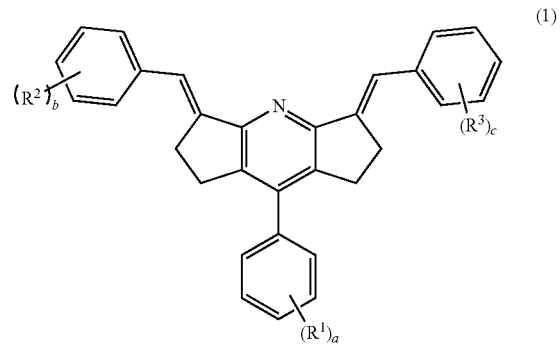

wherein, in Formula (1), each of $R^1$, $R^2$ and $R^3$ independently represents an alkyl group having from 1 to 20 carbon atoms, an alkoxy group having from 1 to 6 carbon atoms, an alkyl ester group having from 1 to 6 carbon atoms, an amino group, an alkyl amino group having from 1 to 20 carbon atoms, a carboxy group, a ciano group, a nitro group, an acetyl group or a (meth) acryloyl group, each of a, b and c independently represents an integer of from 0 to 5, with the proviso that when a is 2 or more, the plural R's are the same or different, when b is 2 or more, the plural $R^2$s are the same or different, and when c is 2 or more, the plural $R^3$s are the same or different.

10. The multilayer substrate according to claim 9, wherein (A) the binder polymer further has a structural unit derived from styrene or α-methylstyrene.

11. The multilayer substrate according to claim 9, wherein (C) the photopolymerization initiator includes at least one selected from the group consisting of 2,4,5-triarylimidazole dimer and a derivative thereof.

12. The multilayer substrate according to claim 9, wherein each of $m_1$, $m_2$, $n_1$ and $n_2$ independently represents an integer of 0 to 40.

13. A method for producing a multilayer substrate with a resist pattern, the method comprising:
  irradiating at least a part of an area of the photosensitive resin composition layer of the multilayer substrate of claim 9 with active light rays, and photo-curing the area to form a cured material area; and
  removing an area other than the cured material area of the photosensitive resin composition layer from the multilayer substrate to form a resist pattern, which is the cured material area, on the multilayer substrate.

14. The method for producing a multilayer substrate with a resist pattern according to claim 13, wherein the active light rays have a wavelength in a range of from 340 nm to 430 nm.

15. A method for producing a printed wiring board, the method comprising:
  subjecting the multilayer substrate with the resist pattern which has been formed using the method for producing a multilayer substrate with a resist pattern according to claim 13, to at least one of etching or plating.

* * * * *